United States Patent
Takei et al.

(10) Patent No.: US 7,881,022 B2
(45) Date of Patent: Feb. 1, 2011

(54) MAGNETIC HEAD AND METHOD FOR FABRICATING THE SAME

(75) Inventors: Hisako Takei, Kanagawa (JP); Nobuo Yoshida, Kanagawa (JP); Hiroyuki Hoshiya, Kanagawa (JP); Taku Shintani, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 947 days.

(21) Appl. No.: 11/788,038

(22) Filed: Apr. 17, 2007

(65) Prior Publication Data

US 2007/0253117 A1 Nov. 1, 2007

(30) Foreign Application Priority Data

Apr. 17, 2006 (JP) .............................. 2006-113655

(51) Int. Cl.
*G11B 5/39* (2006.01)
(52) U.S. Cl. .................................. 360/324.1
(58) Field of Classification Search ................. 360/319, 360/324–324.2
See application file for complete search history.

(56) References Cited

U.S. PATENT DOCUMENTS

| | | | |
|---|---|---|---|
| 6,980,406 B2 * | 12/2005 | Gill | 360/324.12 |
| 7,193,821 B2 * | 3/2007 | Miyauchi | 360/324.1 |
| 7,372,672 B2 * | 5/2008 | Nishiyama | 360/324.11 |
| 7,419,610 B2 * | 9/2008 | Cyrille et al. | 216/22 |
| 7,505,232 B2 * | 3/2009 | Haginoya et al. | 360/319 |
| 2003/0053269 A1 * | 3/2003 | Nishiyama | 360/324.1 |
| 2004/0190205 A1 * | 9/2004 | Miyauchi | 360/324.1 |
| 2005/0045580 A1 | 3/2005 | Baer et al. | |
| 2006/0018055 A1 * | 1/2006 | Haginoya et al. | 360/319 |
| 2007/0035888 A1 * | 2/2007 | Sbiaa et al. | 360/324.1 |
| 2007/0081279 A1 * | 4/2007 | Hong et al. | 360/324.1 |
| 2007/0206333 A1 * | 9/2007 | Watanabe et al. | 360/313 |

FOREIGN PATENT DOCUMENTS

| | | | |
|---|---|---|---|
| JP | 2000182220 A | * | 6/2000 |
| JP | 2002-092825 | | 3/2002 |
| JP | 2003-332651 | | 11/2003 |
| JP | 2004-319064 | | 11/2004 |
| JP | 2004319360 A2 | | 11/2004 |

OTHER PUBLICATIONS

English-machine translation of JP 2000-182220 A (Miura et al), published on Jun. 30, 2000.*

* cited by examiner

*Primary Examiner*—William J Klimowicz
(74) *Attorney, Agent, or Firm*—Zilka-Kotab, PC

(57) ABSTRACT

Embodiments in accordance with the present invention provide a sensor to produce high output with a small track width. Particular embodiments include forming a magnetoresistive sensor of a read head to be substantially vertical in its upper portion and gently upwardly convexly curved in its lower portion.

15 Claims, 14 Drawing Sheets

Fig. 7
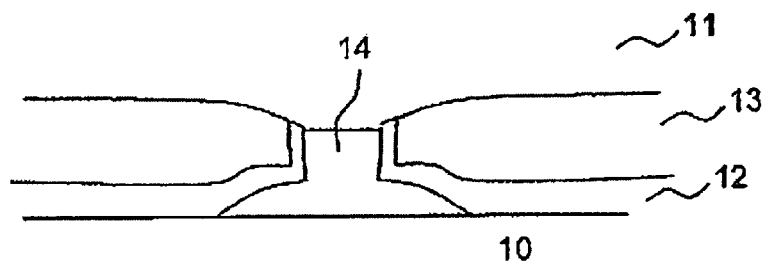
FIG. 8(a) Conventional track shape: incident angle, 10 degrees
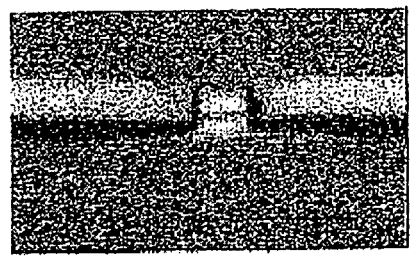
FIG. 8(b) Track shape fabricated with this invention: incident angle, 20 degrees
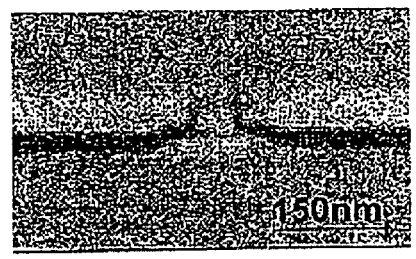

O Sensors fabricated with this invention
● Sensors fabricated with conventional method

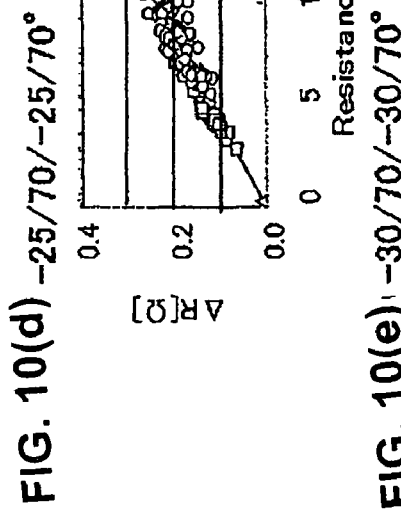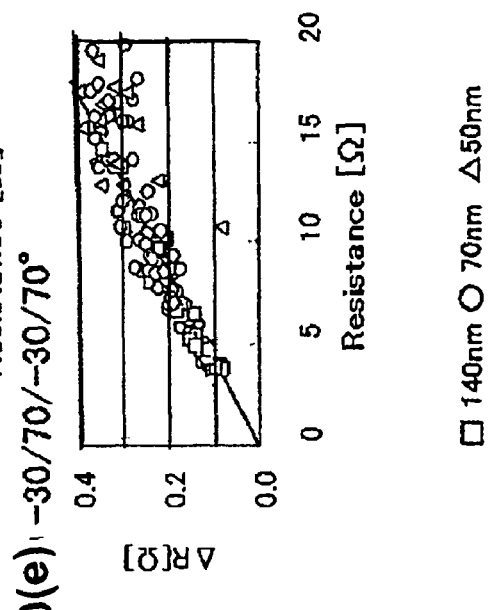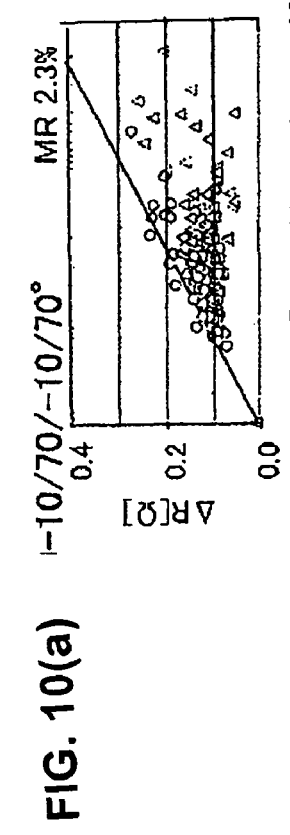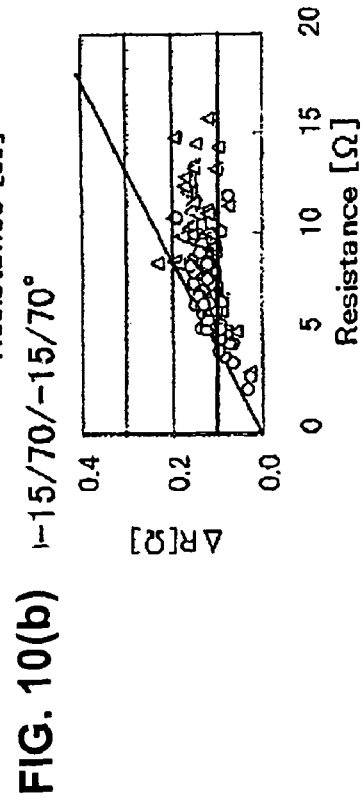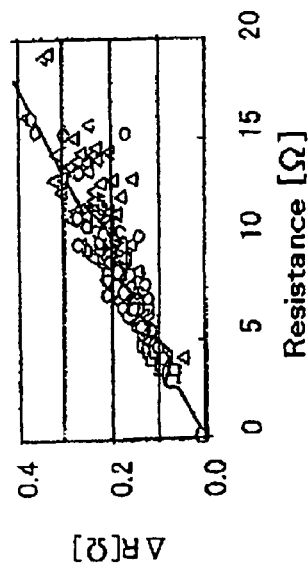
FIG. 10(a) -10/70/-10/70°
FIG. 10(b) -15/70/-15/70°
FIG. 10(c) -20/70/-20/70°
FIG. 10(d) -25/70/-25/70°
FIG. 10(e) -30/70/-30/70°
□ 140nm ○ 70nm △ 50nm

PRIOR ART

Fig. 17
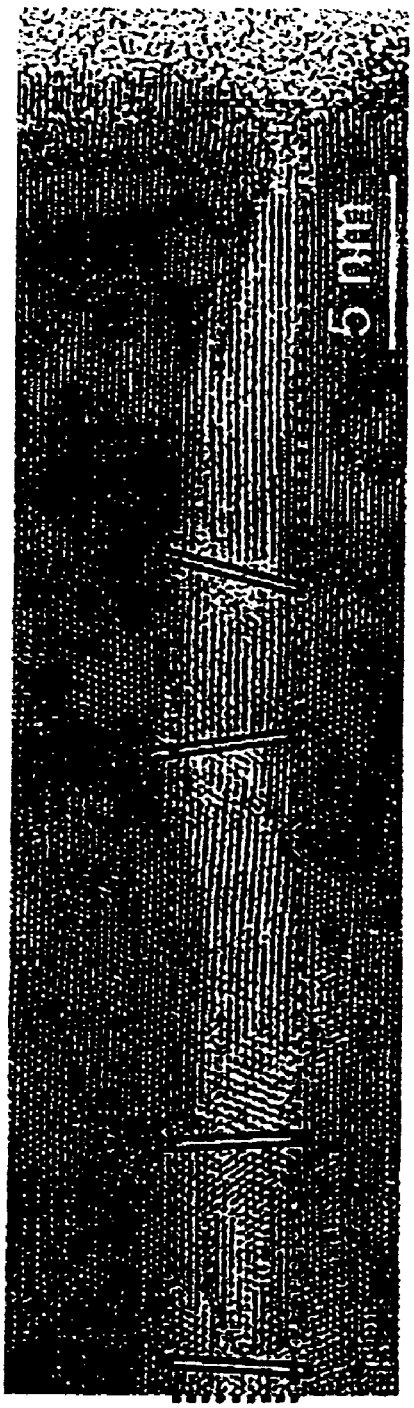
(a) A confined current path layer fabricated with conventional method at incident angle 10 degrees.
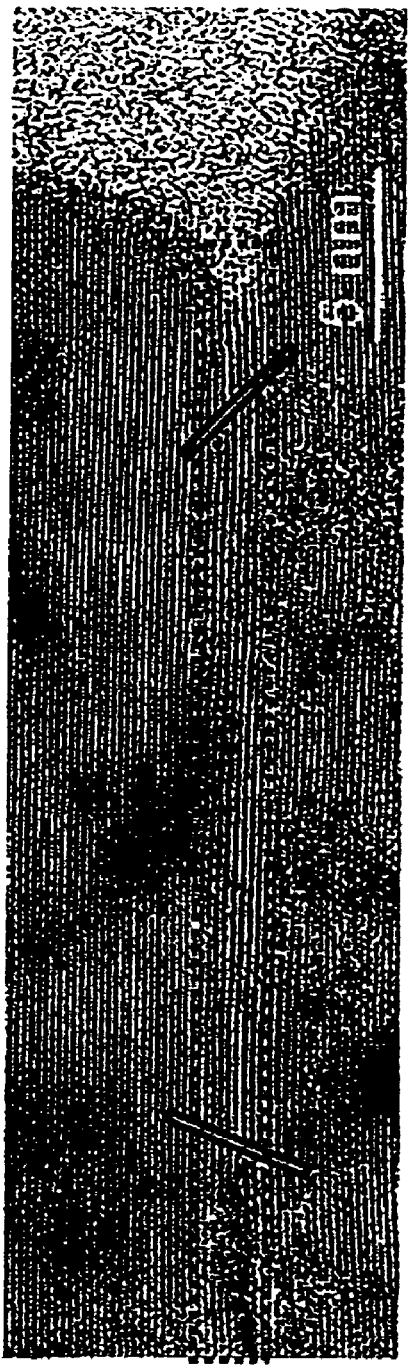
(b) A confined current path layer fabricated with this invention at incident angle 20 degrees.

MAGNETIC HEAD AND METHOD FOR FABRICATING THE SAME

CROSS-REFERENCE TO RELATED APPLICATION

The instant nonprovisional patent application claims priority to Japanese Application No. 2006-113655, filed Apr. 17, 2006 and incorporated by reference in its entirety herein for all purposes.

BACKGROUND OF THE INVENTION

A magnetoresistive magnetic head is used as a read sensor in the field of high-density magnetic recording techniques centered around hard discs. It largely affects the performance of the magnetic recording techniques. As the recording density of magnetic recording apparatuses is rapidly growing higher, it is difficult, using conventional techniques, to realize a magnetic recording apparatus with an adequately high recording density. Particularly, it is difficult to realize a magnetoresistive magnetic head which, having adequate sensitivity and output capacity usable in working on an external field, can be used in the read section of a magnetic recording apparatus and which achieves an adequately stable and good characteristic. Hence, with conventional techniques, it has been difficult to realize functions required of a storage device.

It has been known for years that the magnetoresistive effect of a multilayered film including ferromagnetic metallic layers stacked via a non-magnetic metallic layer, i.e. so-called giant magnetoresistance (GMR), is great. Conventionally, when making use of a magnetoresistive effect for a magnetic head, a so-called CIP-GMR (Current in-plane Giant Magnetoresistive) sensor in which an electric current flows in the plane of the multilayered film used to be adopted. In addition to the CIP-GMR sensor, a tunneling magnetoresistive sensor and a current-perpendicular-to plane giant magnetoresistive sensor, i.e. the so-called TMR sensor and CPP-GMR sensor in which an electric current flows in the film thickness direction of a multilayered film, are currently being studied. These types of sensors are applied to magnetic heads after being patterned into a predetermined size and shape. With regard to their shape, their track width is of a particular importance. Because the track width of a sensor determines the spatial resolution of the sensor, reading high-density magnetic data requires a head with a small track width to be fabricated. The known sensor shapes in the track width direction can be broadly classified into the following three types: a first type in which the side walls of the track are formed linearly; a second type in which the track width is smaller in an upper portion of the element than in a lower portion of the element; and a third type in which the element has side walls which are upwardly concavely curved. Typical sensor shapes of the above types and methods for forming them are described, for example, in Japanese Laid-Open Patent No. JP 2003-332651 (patent document 1), Japanese Laid-Open Patent No. 2004-319060 ("patent document 2"), and Japanese Laid-Open Patent No. 2002-9285 ("patent document 3"). In the Japanese Patent Publication No. 2005/0045580 ("patent document 4"), a sensor fabrication method in which side walls of a track are ion beam etched in plural steps at different incident angles (incident angle ranges of 0 to 30 degrees and 65 to 90 degrees are cyclically repeated) is described.

Conventional types of magnetoresistive sensors have a read section formed of a magnetoresistive multilayered film. Typical examples of such magnetoresistive sensors include GMR films. New types of magnetoresistive multilayered films such as TMR and CPP-GMR films, have also been proposed. In forming a magnetoresistive sensor using one of such films, the magnetoresistive film is formed into a predetermined size in photoresist and etching processes, so as to obtain required magnetic and magnetoresistive characteristics. FIG. 1 shows an example of the shape of a CPP type magnetoresistive sensor as viewed from the side to face a recording medium. As shown in FIG. 1, a seed layer 25, an anti-ferromagnetic film 24, a pinned layer 23, an intermediate layer 22, a free layer 21, and an upper electrode layer 239 are stacked over a lower electrode layer 240, and an insulator layer 12 and a domain control layer 131 are formed on sides of the element. The width perpendicular to the film thickness direction of the free layer 21 is regarded as the track width. The inclination of the side walls of the track is formed by etching, such as ion beam etching or reactive ion beam etching, using the resist formed on the element by photolithography as a mask. Ion beam etching is performed as shown in FIG. 2, using a resist 3 formed over a magnetoresistive sensor 14 as a mask. During etching, magnetoresistive film fragments removed from the magnetoresistive film bombarded by argon ions (irradiated with argon ions) may redeposit on the side walls being etched. If, after the element has been formed, the redeposition is left on the side walls, an electric current flows through the redeposition whose electric resistance is lower than that of the magnetoresistive sensor. This degrades the magnetoresistive effect of the element.

The damage suffered by the magnetoresistive sensor when irradiated with argon ions in an etching process can also degrade the magnetoresistive effect of the element. When the side walls of the magnetoresistive sensor are bombarded by argon ions during etching, crystals in the vicinity of the side walls or portions of a tunneling barrier layer and an intermediate layer in the vicinity of the side walls may be deteriorated. When the track width of an element is smaller, a relatively larger area of the element is affected by etching. This increases the influence of characteristic degradation. To prevent such characteristic degradation of a magnetoresistive sensor, forming the element such that its side walls are gently inclined as described in the patent document 4 is considered effective. Because, when the side walls are inclined, ion beam etching performed to form the element into a predetermined width also serves to remove the redeposition on the side walls. Such a method, however, lowers the accuracy of the sensor track width because it is geometrically difficult to specifically define the width of a track, particularly, the width of a free layer having gently inclined side walls.

Thus, the conventional techniques pose a problem. Namely, forming the side walls of a magnetoresistive sensor to be vertical or nearly vertical so as to improve the width accuracy results in characteristic degradation, and forming the side walls to be inclined so as to prevent characteristic degradation lowers the width accuracy. It has therefore been difficult to develop and mass-produce high-output sensors with a small track width.

Furthermore, in cases where lift-off is performed by CMP (chemical mechanical polishing) to form a small magnetoresistive sensor, there have been concerns that oxide layers of the element, for example, tunnel gap and current confining structures, may be damaged, thereby decreasing the output capability of the element.

BRIEF SUMMARY OF THE INVENTION

Embodiments in accordance with the present invention provide a sensor to produce high output with a small track width. In the particular embodiment disclosed in FIG. 2 of the present invention, a magnetoresistive sensor (14) of a read head is formed to be substantially vertical in its upper portion and gently upwardly convexly curved in its lower portion.

BRIEF DESCRIPTION OF THE DRAWINGS

FIG. 7 is a diagram showing a fabrication method according to embodiments of the present invention.

FIGS. 8(a) and 8(b) are cross-sectional scanning electron micrographs (SEM images) of a prior-art embodiment and an embodiment according to embodiments of the present invention, respectively.

FIGS. 10(a) to 10(e) are diagrams showing element resistances and MR ratios of elements formed at different incident angles.

FIGS. 17(a) and 17(b) are diagrams showing TEM micrographs of confined current path layers formed according to prior art and according to the present invention, respectively, the diagrams having been prepared with attention to crystalline structures.

DETAILED DESCRIPTION OF THE INVENTION

Embodiments in accordance with the present invention relate to a magnetic recording apparatus with a high recording density, more particularly, to a magnetoresistive sensor of a magnetic head included in a hard disc storage.

According to embodiments of the present invention, the shape in the film thickness direction of a magnetoresistive sensor is made different between an upper portion and a lower portion which are approximately divided by an intermediate layer. To be more detailed, the side walls of the element are formed to be vertical in the upper portion and wider and upwardly convexly curved in the lower portion. To form the above shape, the magnetoresistive sensor is etched using different ion incident angles, at least, between the upper and lower portions of the element. Forming a magnetoresistive sensor as described above can reduce the redeposition on the side walls of the element and also reduce the damage to the element caused by etching. It can also prevent stress concentration on the element even in a lift-off process using CMP and the formation of unnecessary corners, which may cause magnetic instability, on a magnetic shield or a domain control layer. Embodiments of the present invention can, therefore, realize a magnetoresistive sensor structure which can offer high resolution, high read output, and high stability.

According to embodiments of the present invention, it is possible to realize high read output and high stability using a magnetic head with a smaller magnetic sensor. Furthermore, embodiments of the present invention can make a magnetic recording system capable of high-density recording, namely, capable of recording on a narrow recording track at a short recoding length.

An approach for forming a magnetic head according to embodiments of the present invention will be described in the following with reference to FIGS. 3(a) to 3(h).

Figure 1:
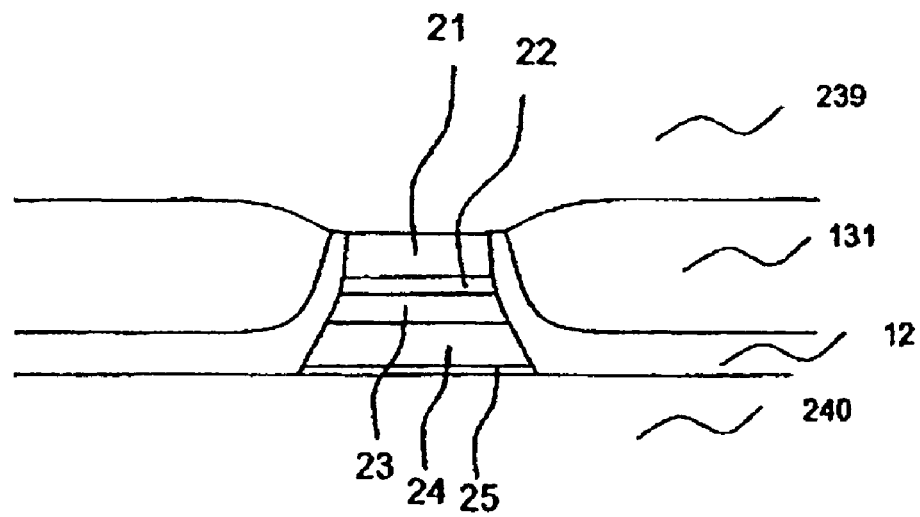
FIG. 1 is a conceptual diagram of a conventional read head structure.
Figure 2:
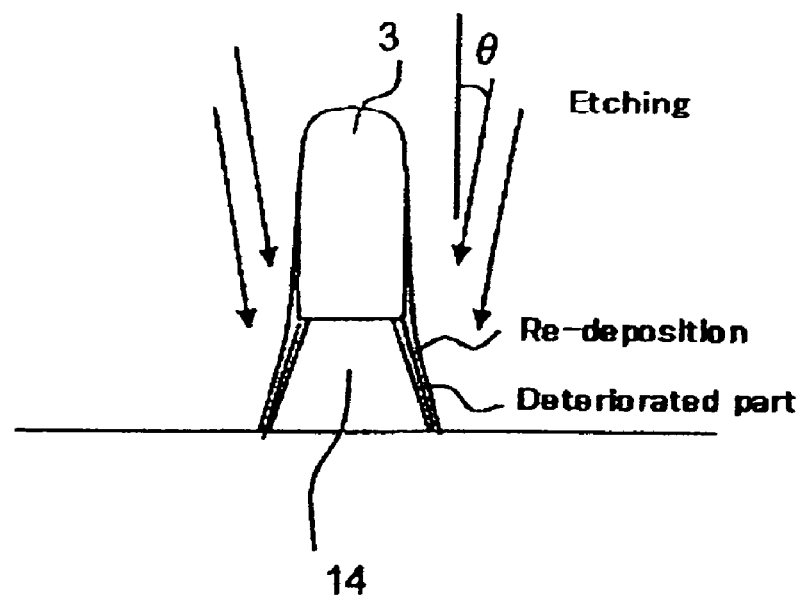
FIG. 2 is a conceptual diagram showing MR ratio degradation caused by ion beam etching.
Figure 3:
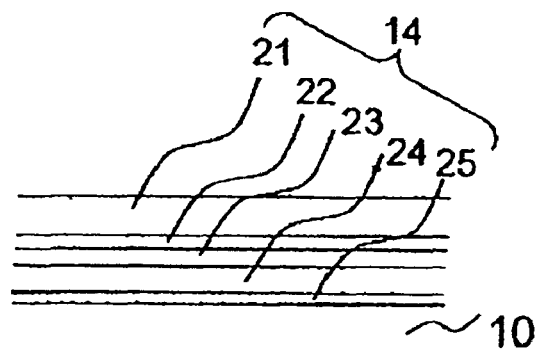
FIGS. 3(a)-(h) are a diagrams showing a read head fabrication process according to embodiments of the present invention.
Figure 3:
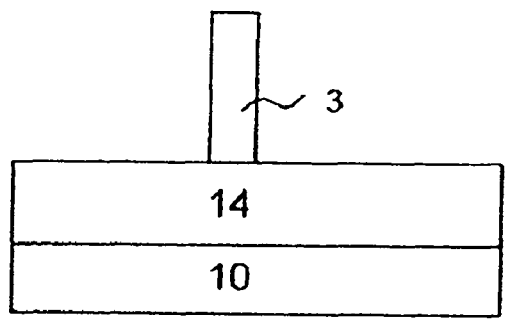
Figure 3:
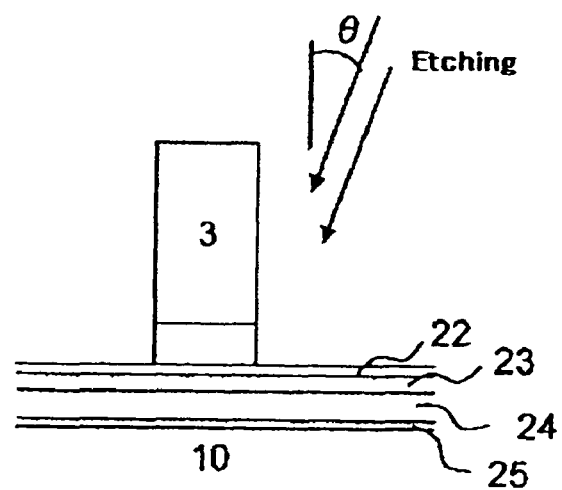
Figure 3:
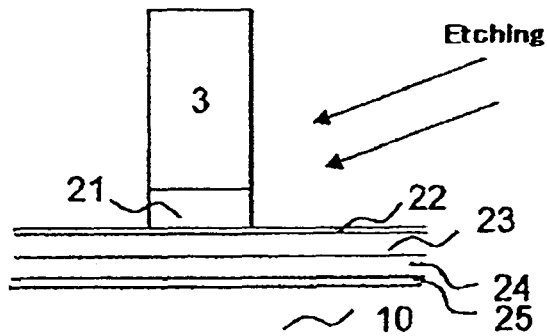
Figure 3:
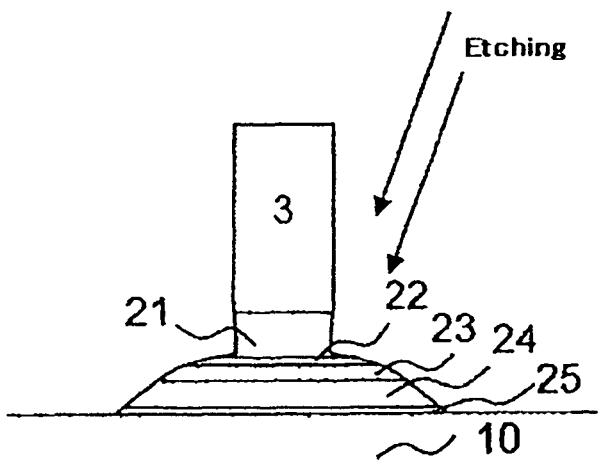
Figure 3:
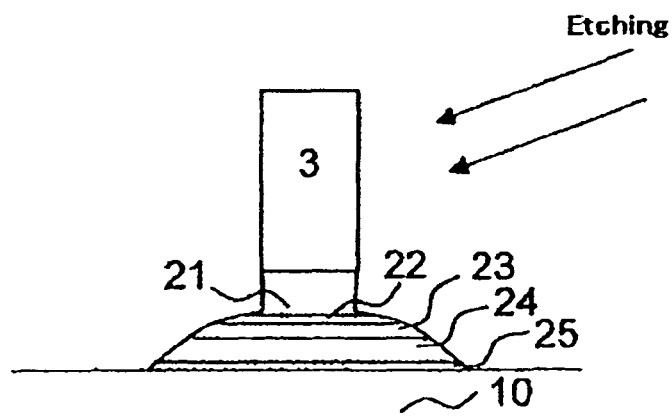
Figure 3:
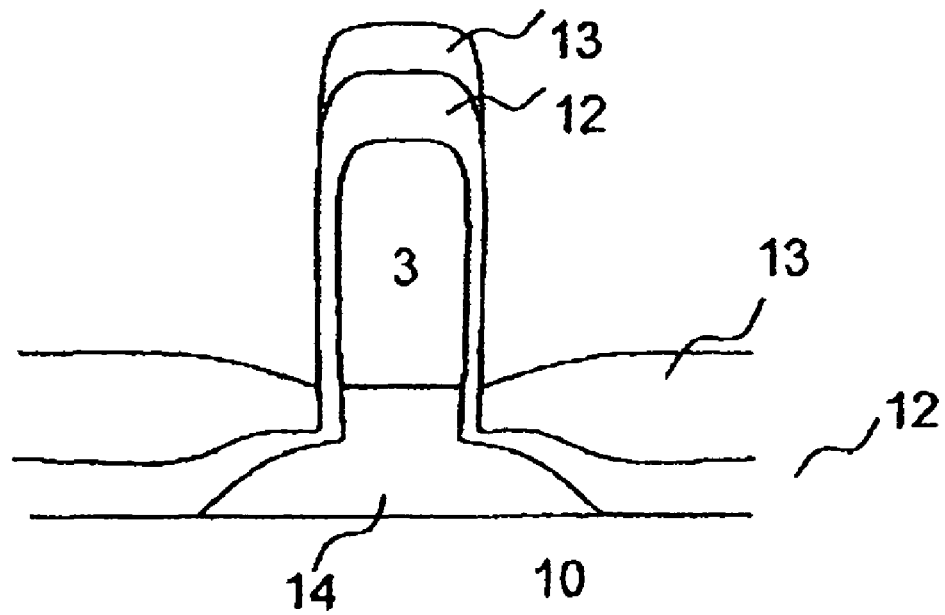
Figure 3:
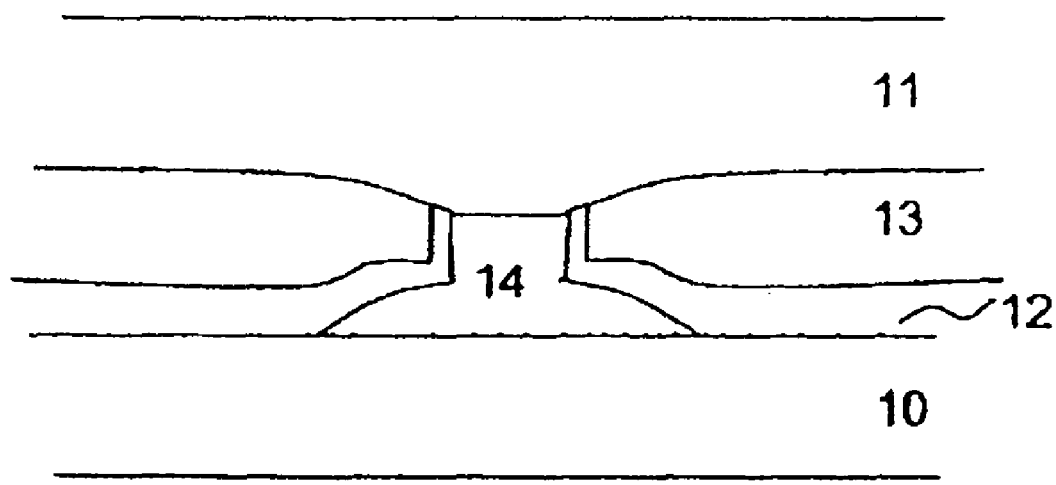

The read sensor shown in the drawings is of a bottom type in which a pinned layer is provided on the substrate side and in which an in-stack domain control layer for aligning the magnetic domains of a free layer is stacked over the free layer. Namely, as shown in FIG. 3(a), a seed layer 25, an anti-ferromagnetic film 24, a pinned layer 23, an intermediate layer 22, and a free layer 21 are stacked, as a magnetoresistive sensor 14, over a lower shield 10. Next, as shown in FIG. 3(b), a mask 3 is formed by lithography on the magnetoresistive sensor 14. Next, a magnetoresistive film pattern is formed by ion beam etching. In this process, an incident angle θ is changed in four steps. Namely, etching is made, as shown in FIG. 3(c), down to the intermediate layer 22 at an incident angle θ of 15° to 30°. Next, as shown in FIG. 3(d), etching is performed at an incident angle θ of 60° to 80° to remove the material redeposited on the top portion down to the intermediate layer 22 of the element. Then, as shown in FIG. 3(e), etching is made down to the seed layer 25 again at an incident angle of 15° to 30°. Furthermore, as shown in FIG. 3(f), the redeposition on the side walls of the element is removed at an incident angle θ of 60° to 80°. The incident angle is defined as the ion beam incident angle to the substrate normal.

The reason why the incident angle is 15° to 30° for the processes shown in FIGS. 3(c) and 3(e) is as follows. If the incident angle is smaller than 15°, the ion beam is incident on the substrate almost perpendicularly, so that an upwardly convexly curved shape of embodiments of the present invention cannot be formed. If the incident angle is larger than 30°, the element cannot be formed such that the side walls of the track are perpendicular to the substrate in the portion above the intermediate layer of the element. The reason why the incident angle is 60° to 80° for the processes shown in FIGS. 3(d) and 3(f) is as follows. If the incident angle is smaller than 60°, while the redeposition is removed, effects of vertical etching also occur making it difficult to obtain the element shape of embodiments of the present invention. If the incident angle is larger than 80°, the incident ion beam becomes almost parallel to the substrate surface, so that it becomes difficult to make the ion beam fall on the whole substrate surface.

The side wall inclination in the track width direction of the free layer 21 is held within ±15° from vertical so as to keep the dimension error in the track width direction of the free layer 21 within ±2 nm. This makes it possible to form a track with a dimension error in the track width direction of 10% or less even in a case where the track width is as small as 50 nm.

Next, as shown in FIG. 3(g), an insulator layer 12 and a protective layer 13 are formed around the magnetoresistive sensor 14 having been patterned in the above processes, and then the mask 3 and the insulator layer 12 and protective layer 13 that deposited on the mask are removed. Subsequently, as shown in FIG. 3(h), an upper shield 11 is formed.

The protective layer 13 may be one designed to serve also as, or to be used also as part of, a side-shield structure or a domain control layer. A side-shield structure is made of soft-magnetic material and has an effect to absorb stray fields from adjacent tracks. In a case where the protective layer is made to serve also as a side-shield structure, it is made of a soft magnetic material such as permalloy (Ni—Fe). Using such a protective layer makes it possible to produce a read head with a high spatial resolution. In a case where the protective layer is made to serve also as a domain control layer, it is made of a high coercivity material such as cobalt chrome platinum (CoCrPt). Such a protective layer makes single domain control for the free layer easy.

The bottom width in the track width direction of a lower curved portion of an element formed by the above method using an incident angle of 15° to 30° measured two to six times the width of the free layer 21.

Figure 4:
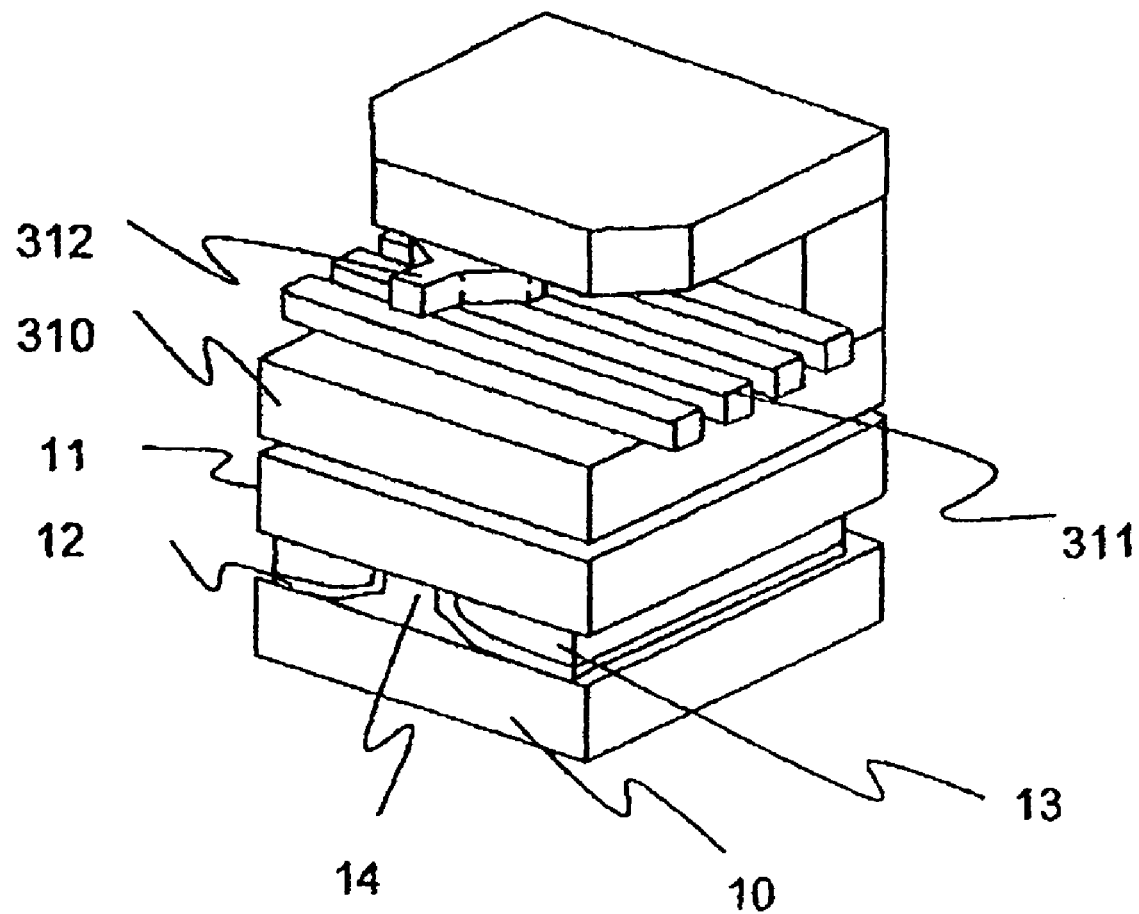
FIG. 4 is a conceptual diagram of a magnetic recording system.

FIG. 4 is a schematic diagram of a magnetic head according to embodiments of the present invention, the magnetic head combining a read head and a write element of a perpendicular magnetic recording type. In FIG. 4, the magnetic head is shown as seen from the air bearing surface. The write element includes a sub pole 310, a coil 311, and a main pole 312.

Figure 5:
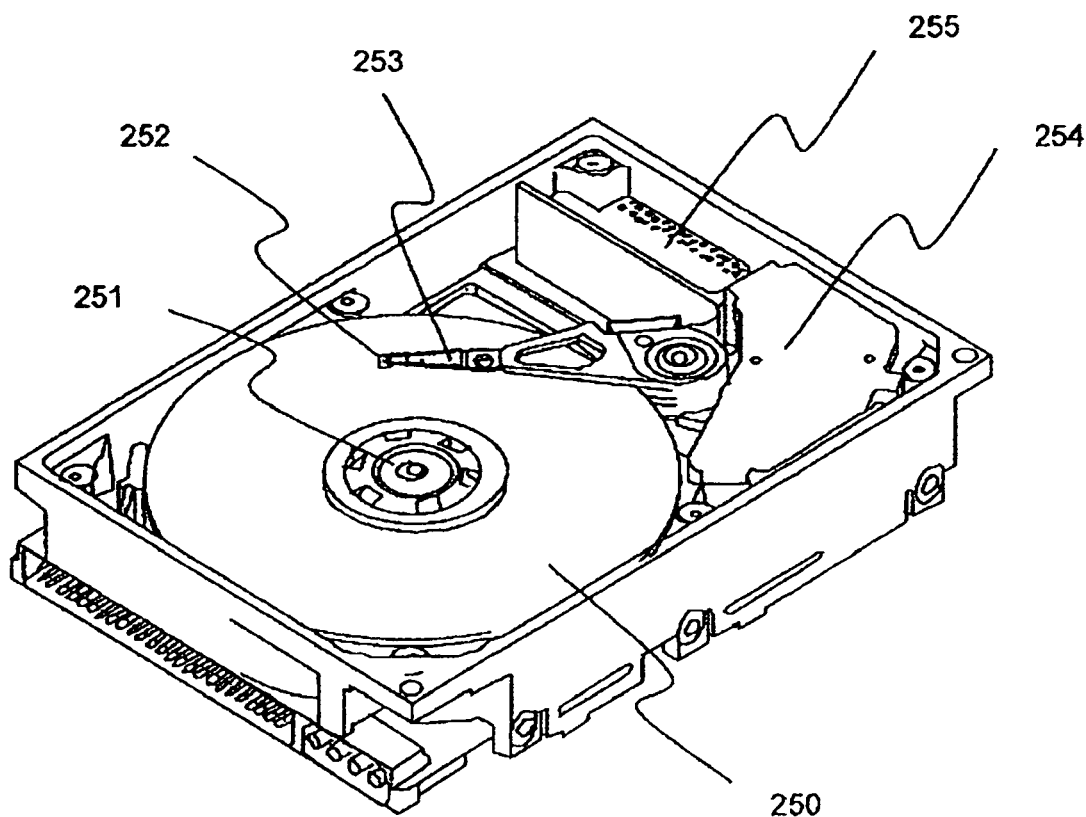
FIG. 5 is a conceptual diagram of a magnetic head.

FIG. 5 is a schematic diagram showing an example of a magnetic disc device using a magnetic head according to embodiments of the present invention. The magnetic disc device includes a disc 250, a spindle motor 251, a magnetic head 252, an arm 253, an actuator 254, and a signal processing circuit 255. The spindle motor 251 rotates the recording disc having a magnetic recording layer, and the magnetic head 252 writes and reads data to and from the recording disc. The magnetic head is at an end of the arm 253. Positioning of the magnetic head in the radial direction of the magnetic disc is determined by the actuator 254.

In the following, the present invention will be described concretely based on embodiments.

Embodiment 1

Figure 6:
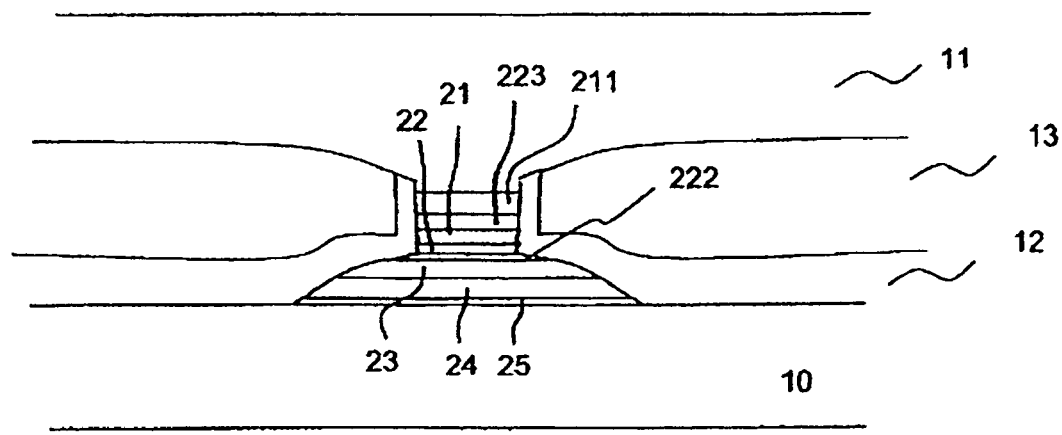
FIG. 6 is a diagram showing the shape of a typical magnetoresistive sensor according to embodiments of the present invention.

FIG. 6 is a diagram showing a structure of a typical magnetoresistive sensor according to one embodiment of the present invention. The read head shown in FIG. 6 is as seen from the air bearing surface. The magnetoresistive sensor formed over a lower shield 10 has stacked layers including a seed layer 25, an anti-ferromagnetic film 24, a pinned layer 23, a confined current path layer 222, an intermediate layer 22, a free layer 21, an in-stack domain control layer 223, and a capping film 211. The magnetoresistive film stack used in the present embodiment is formed by stacking required magnetoresistive film materials sequentially over a substrate using a dc magnetron sputtering apparatus.

The free layer 21 has a two-layer structure in which, for example, NiFe (2 nm) is formed over CoFe (1 nm). The free layer 21 may also be of a multilayered type including, for example, NiFe/Ru/NiFe/CoFe. The pinned layer 23 has a synthetic structure in which a non-magnetic Ru layer (0.8 nm) is sandwiched between two ferromagnetic layers of a cobalt-iron alloy (CoFe, 30 nm). The intermediate layer is a non-magnetic layer of Cu (0.5 nm). The confined current path layer 222 typically includes a partly oxidized crystalline oxide (for example, 5-nm thick CoO film) and a metal crystal portion (for example, about 5 nm thick CoFe film), and has a function to increase output by screening the electric current flowing in the film thickness direction. The in-stack domain control layer 223 includes, for example, an anti-ferromagnetic material (15 nm) such as manganese platinum (MnPt) or manganese iridium (MnIr) formed over a cobalt-iron alloy (CoFe (2.5 nm)). The anti-ferromagnetic film 24 includes an anti-ferromagnetic material (15 nm) such as manganese platinum (MnPt) or manganese iridium (MnIr). An upper shield 11 forms, between itself and the lower shield 10, a read gap of a predetermined width. The capping film 211, while protecting the magnetoresistive sensor 14, appropriately positions the free layer 21 in the read gap. The capping film 211 includes, for example, Ru, and has a thickness of about 10 nm. The lower shield 10 and the upper shield 11 are made of a magnetic metal, for example, NiFe. The insulator layer 12 is for providing insulation between the upper shield 11 and the lower shield 10. It is made of an insulating material (about 15 nm) such as $Al_2O_3$. The protective layer 13 is a side-shield structure. It is made of a soft-magnetic material such as permalloy (Ni—Fe).

A principal feature of embodiments of the present invention is in the shape of the magnetoresistive sensor. Magnetoresistive sensors used in conventional read heads have a trapezoidally shaped air bearing surface which faces a track width portion of a recording medium. The read head according to embodiments of the present invention has a magnetoresistive sensor whose air bearing surface (ABS) is, as shown in FIG. 6, shaped such that: the width in the track width direction of the free layer 21 is smaller than that of the pinned layer 23; the free layer 21 and the pinned layer 23 differ from each other in side wall inclination with the side walls of the free layer 21 more inclined than those of the pinned layer 23; and the side walls of the pinned layer 23 are convexly curved in the film thickness direction.

The element shape according to embodiments of the present invention, firstly, can improve the track width accuracy by forming the side walls in an upper portion of the magnetoresistive sensor to be almost vertical to the substrate. The element shape according to embodiments of the present invention, secondly, is expected to bring about a side wall cleaning effect by forming the side walls in a lower portion of the magnetoresistive sensor to be convexly curved in the film thickness direction as shown in FIG. 6. The side wall cleaning effect can reduce the amount of material redeposited on the side walls of the magnetoresistive sensor. This can eventually prevent degradation of the MR ratio caused when electric current flows through redeposited material without properly flowing through the magnetoresistive sensor. In forming the magnetoresistive sensor according to embodiments of the present invention, the side walls of the track are etched at a large incident angle and the curved portions are formed in the process. In this way, material redeposition can be reduced and, hence, the time for etching to remove redeposited material can also be reduced. As a result, the possibility of a crystal structure and an intermediate layer being damaged by argon ions used in etching is also reduced, so that the degradation of the MR ratio occurring when the track width is small can be reduced.

A read head fabrication process according to the present embodiment will be described in the following. The read head is fabricated by a photolithography method and an ion beam etching system as follows.

As shown in FIG. 3(b), the mask 3 is patterned on the magnetoresistive sensor 14 by photolithography. The mask may be a single-layer photoresist mask which can be patterned by exposure to ultraviolet rays (for example, ArF or KrF excimer laser) or electron beam. It may also be of a two-layer structure including an undercut, or of a type using a multilayered resist including photoresist, an intermediate layer resistant to $O_2$ plasma, and a hard mask. The mask is 100 nm to 200 nm high. When the height is 50 nm or higher at the time of lifting off the resist, the resist can be lifted off with ease. The etching mask pattern is preferably about two to three times as high as the magnetoresistive sensor so that it can withstand etching while the magnetoresistive sensor is being formed and also so that it can stay unbroken when formed on the magnetoresistive sensor.

Next, in an ion beam etching process, the magnetoresistive sensor 14 is formed into a predetermined width. FIGS. 3(c) to 3(f) show the process in detail. In the present embodiment, the ion etching process to form the magnetoresistive sensor 14 is performed in four steps correspondingly changing the incident angle θ from 20° to 70° to 20° to 70°. The methods that can be used to etch a magnetoresistive film include an ion beam etching method and a reactive ion etching method.

The insulator layer 12 and the protective layer 13 are formed such that they cover both sides of the element and the exterior of the mask as shown in FIG. 3(g). Subsequently, the mask is lifted off (see FIG. 7). The lift-off can be performed, for example, in an ordinary way, or by a method in which resist stripper is discharged at a high pressure, or by chemical mechanical polishing (CMP). Next, the upper shield 11 is formed.

A wafer having a magnetoresistive sensor formed, as described above, into a predetermined width was processed into a slider to fabricate a magnetic head, and the magnetic head thus fabricated was installed in a magnetic recording system for evaluation. The magnetoresistive head fabricated as described above is, as shown in FIG. 6, shaped such that: the width in the track width direction of the free layer is smaller than that of the pinned layer; the free layer and the pinned layer differ from each other in side wall inclination with the side walls of the free layer more inclined than those of the pinned layer; and the side walls of the pinned layer are convexly curved in the film thickness direction. This was also confirmed by observing the air bearing surface of the head.

FIG. 8(a) shows an SEM image of a conventional magnetoresistive sensor as seen from its ABS side, and FIG. 8(b) an SEM image of a magnetoresistive sensor according to embodiments of the present invention as seen from its ABS side. The magnetoresistive sensor shown in FIG. 8(a) is one formed by etching performed in four steps correspondingly changing the incident angle θ from 10° to 70° to 10° to 70°, and has a shape similar to that of a conventional magnetoresistive sensor. The element according to embodiments of the present invention shown in FIG. 8(b), has a predetermined shape in the track width direction formed by etching performed by changing the incident angle θ from 20° to 70° to 20° to 70°. Its upper portion above the intermediate layer is linearly formed whereas its lower portion below the intermediate layer is curvedly formed.

Figure 9:
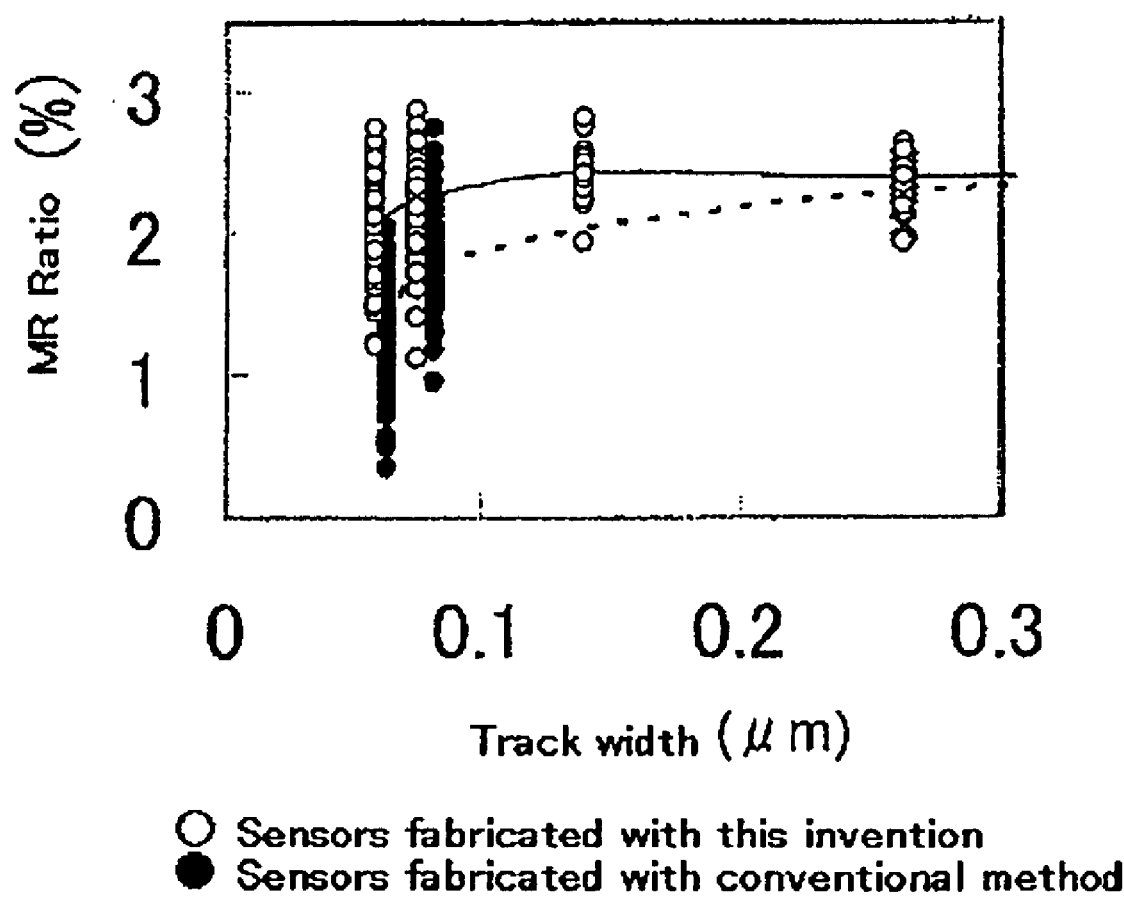
FIG. 9 is a characteristic diagram comparing prior art and embodiments of the present invention in terms of MR ratios.

FIG. 9 shows magnetoresistive characteristics of the magnetoresistive sensors formed in the above way. In FIG. 9, magnetoresistance ratios (MR ratios) relative to track width are plotted. The MR ratios of the elements shaped as shown in FIG. 8(a), lower as the track width narrows from a 70 to 80 nm range to a 45 to 60 nm range. The MR ratios of the magnetoresistive sensors shaped according to embodiments of the present invention as shown in FIG. 8(b), on the other hand, do not lower so much as those of the conventionally shaped elements even when their track width narrows. This is considered attributable to a larger incident angle and a shorter etching time used in forming the magnetoresistive sensors according to embodiments of the present invention. For, a larger incident angle reduces redeposition and forms the elements to be wider toward its bottom, and a shorter etching time reduces the damage caused by etching to the side walls of tracks of the elements, thereby reducing MR ratio degradation.

FIGS. 10(a) to 10(e) are diagrams showing the change in resistance relative to element resistance. FIG. 10(a) is of conventionally shaped elements. FIGS. 10(b) to 10(e) are of elements shaped according to embodiments of the present invention. In each of the diagrams: a square represents a measurement on an element with a track width of 140 nm; a circle represents a measurement on an element with a track width of 70 nm; and a triangle represents a measurement on an element with a track width of 50 nm. The straight line in each of the diagrams represents an MR ratio of 2.3%. When a measurement on an element falls on the line, the element may be said to be one which was not damaged while being formed. The MR ratios of the elements formed at an incident angle of 10° are lower than 2.3% whether their track width is 50 nm or 70 nm. This indicates that their MR ratios were lowered to about a half due to damage they suffered while being formed. The MR ratios of the elements formed at an incident angle of 15° are slightly closer to the line representing the MR ratio of 2.3% than those of the elements formed at an incident angle of 10°, indicating that the degradation of the MR ratio was reduced. The MR ratios of the elements formed at incident angles of 20°, 25° and 30°, respectively, are distributed mostly along the line representing the MR ratio of 2.3%, indicating that their MR ratios did not degrade.

The effects of the element structure according to embodiments of the present invention will be described in the following in comparison to a conventional element structure. There are known techniques in Which elements are formed to be wider in their lower portion below a pinned layer than in their upper portion above the pinned layer, though the element structures obtained using such techniques differ from the element structure according to embodiments of the present invention.

The effectiveness of embodiments of the present invention will be described with reference to the conventional method described in Japanese Laid-Open Patent No. 2004-319060 ("patent document 2"). In the method described in JP 2004-319060, an element is formed through two photoresist processes to be wide in its lower portion and narrow in its upper portion as roughly shown in FIG. 11. According to embodiments of the present invention, however, an element can be formed through one photoresist process. Therefore, the method according to embodiments of the present invention is simpler. In addition, in the method according to embodiments of the present invention, dimensions of the upper and lower portions of an element as well as their relative positions are automatically and accurately determined based on self-alignment not to cause positional errors.

Figure 11:
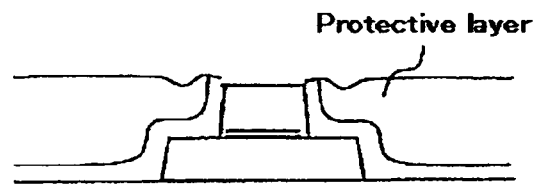
FIG. 11 is a conceptual diagram of an example structure according to prior art.

Whereas the structure shown in FIG. 11 includes angular corners in a lower portion, embodiments of the present invention allows an element to be formed such that the corners in its lower portion are appropriately round. Embodiments of the present invention, therefore, have an advantage in that a domain control layer and a protective layer for preventing the magnetoresistive sensor from being affected by unnecessary magnetic fields, can be formed to be closer to a free layer. Furthermore, it is also obviously advantageous that no undesirable kink to make the domain control section and shield section unstable is generated in such sections. Also, whereas the side walls of the upper and lower portions of the structure shown in FIG. 11 are substantially vertical, in embodiments of the present invention, an element is formed at an incident angle of 15° to 30°, allowing the redeposition on the side walls of the element to be removed during etching. In such a way, the damage to the element caused by etching and electric current leakage can both be reduced.

Embodiment 2

Figure 12:
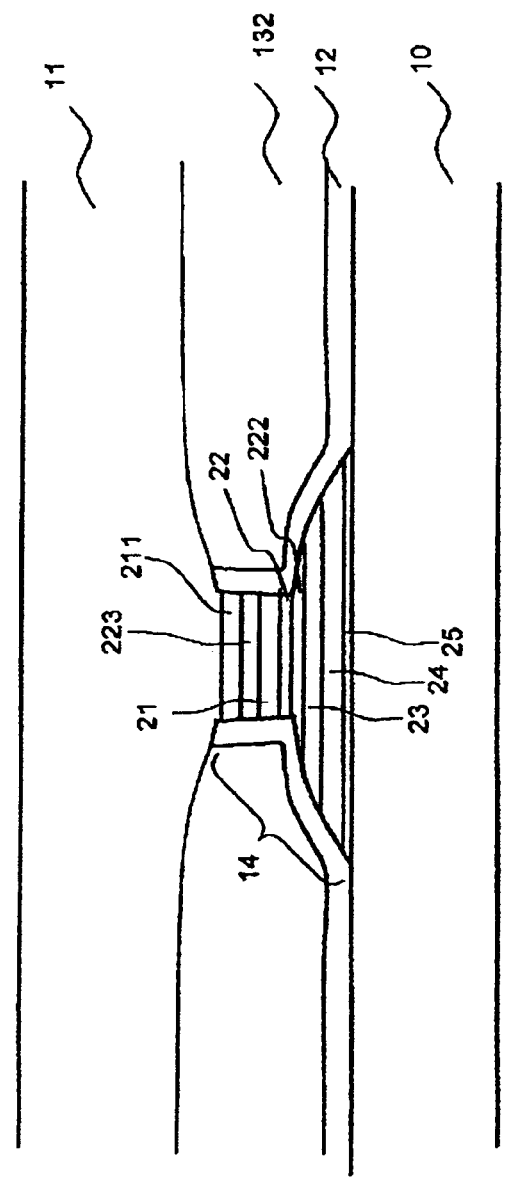
FIG. 12 is a conceptual diagram showing an element structure using a side shield according to embodiments of the present invention.

FIG. 12 shows another structure of a read head according to embodiments of the present invention. A magnetoresistive sensor 14 includes, as shown in FIG. 12, a seed layer 25, an anti-ferromagnetic film 24, a pinned layer 23, an intermediate layer 22, a free layer 21, and an in-stack domain control layer 223 which are formed over a lower shield 10. An upper shield 11 forms, between itself and the lower shield 10, a read gap of a predetermined width. A capping film 211, while protecting the magnetoresistive sensor 14, appropriately positions the free layer 21 in the read gap. In the magnetoresistive sensor 14, the walls are formed differently between upper and lower portions in the film thickness direction, the two portions divided approximately by the intermediate layer 22. An insulator layer 12 and a protective layer and side-shield film 132 are formed on both sides in the track width direction of the free layer. The protective layer and side-shield film 132 is made of a soft magnetic material such as permalloy (Ni—Fe). The insulator layer 12, the protective layer and side-shield film 132, and the upper shield 11 are formed over the gently sloped walls in a bottom portion of the magnetoresistive sensor 14, so that the protective layer and side-shield film 132 and the upper shield 11 are free of unnecessary corners and steps. This makes the magnetoresistive sensor less likely to suffer physical damage and enhances the magnetic stability of the element. A protective layer 13 may be formed over the protective layer and side-shield film 132. In the structure shown in FIG. 12, the protective layer and side-shield film 132 is covered by the upper shield 11. The read head thus structured of the present embodiment can produce a high output and realize high spatial resolution.

The effects of embodiments of the present invention are unchanged as long as the invention is applied to a device in which a sensing current flows through a magnetoresistive sensor film, for example, a device using a CPP-GMR effect without having a confined current path layer.

Embodiment 3

Figure 13:
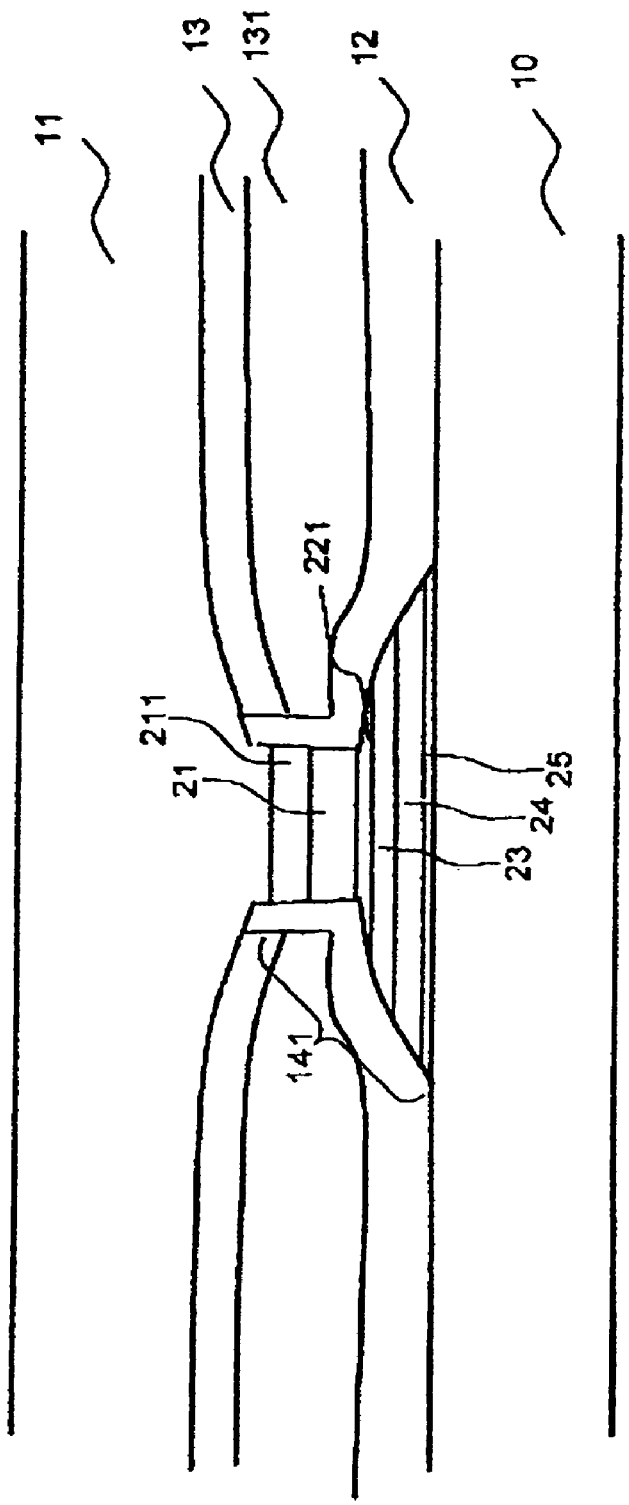
FIG. 13 is a conceptual diagram showing a structure of a tunneling magnetoresistive magnetic head according to embodiments of the present invention.

FIG. 13 shows a still another structure of a read head according to embodiments of the present invention. A tunneling magnetoresistive sensor 141 includes, as shown in FIG. 13, a seed layer 25, an anti-ferromagnetic film 24, a pinned layer 23, a tunneling gap layer 221, and a free layer 21 which are formed over a lower shield 10. In the tunneling magnetoresistive sensor 141, the walls are formed differently between upper and lower portions in the film thickness direction, the two portions divided approximately by the tunneling gap layer 221. An insulator layer 12 and a domain control layer 131 are formed on both sides in the track width direction of the free layer 21. The insulator layer 12, the domain control layer 131, a protective layer 13, and an upper shield 11 are formed over the gently sloped walls in a bottom portion of the magnetoresistive sensor 14, so that the domain control layer 131 and the upper shield 11 are free of unnecessary corners and steps. This makes the magnetoresistive sensor less likely to suffer physical damage and enhances the magnetic stability of the element. The domain control layer 131 is made of a high coercivity material such as cobalt chrome platinum (CoCrPt). The protective layer 13 is formed over the domain control layer 131. The upper shield 11 is positioned so as to form a read gap of a predetermined size between itself and the lower shield 10. A capping film 211, while protecting the magnetoresistive sensor 14, appropriately positions the free layer 21 in the read gap. The read head thus structured of the present embodiment can produce a high output and realize good stability.

The effects of embodiments of the present invention are unchanged as long as the invention is applied to a device comprising a magnetoresistive sensor through which a sensing current flows.

Embodiment 4

Figure 14:
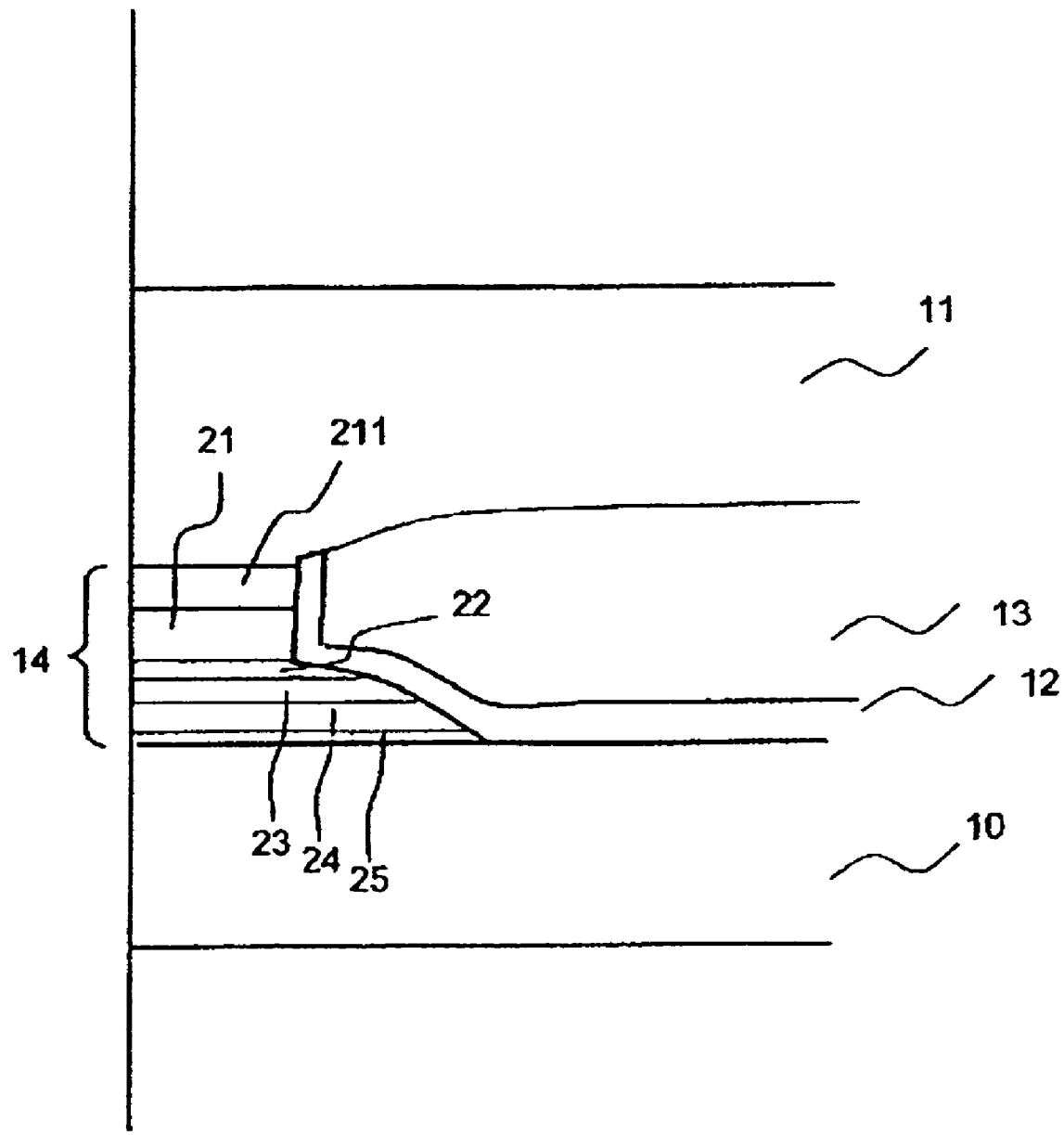
FIG. 14 is a conceptual diagram showing a structure in the MR height direction of an element according to embodiments of the present invention.

FIG. 14 shows a structure in the MR height direction of an element according to embodiments of the present invention. A magnetoresistive sensor 14 includes a seed layer 25, an anti-ferromagnetic film 24, a pinned layer 23, an intermediate layer 22, and a free layer 21 which are formed over a lower shield 10. In the magnetoresistive sensor 14, the walls are formed differently between upper and lower portions in the film thickness direction, the two portions divided approximately by the intermediate layer 22 as viewed cross-sectionally in the MR height direction. An insulator layer 12 and a protective layer 13 are formed at a location beyond the magnetoresistive sensor 14 (on the left of the element as seen in FIG. 14). An upper shield 11 is positioned so as to form a read gap of a predetermined size between itself and the lower shield 10. A capping film 211, while protecting the magnetoresistive sensor 14, appropriately positions the free layer 21 in the read gap. The insulator layer 12, the protective layer 13, and the upper shield 11 are formed over the gently sloped walls in a bottom portion of the magnetoresistive sensor 14, so that the upper shield 11 is free of unnecessary corners and steps. This makes the magnetoresistive sensor less likely to suffer physical damage and enhances the magnetic stability of the element. The read head thus structured of the present embodiment can produce a high output and realize good stability.

Embodiment 5

Figure 15:
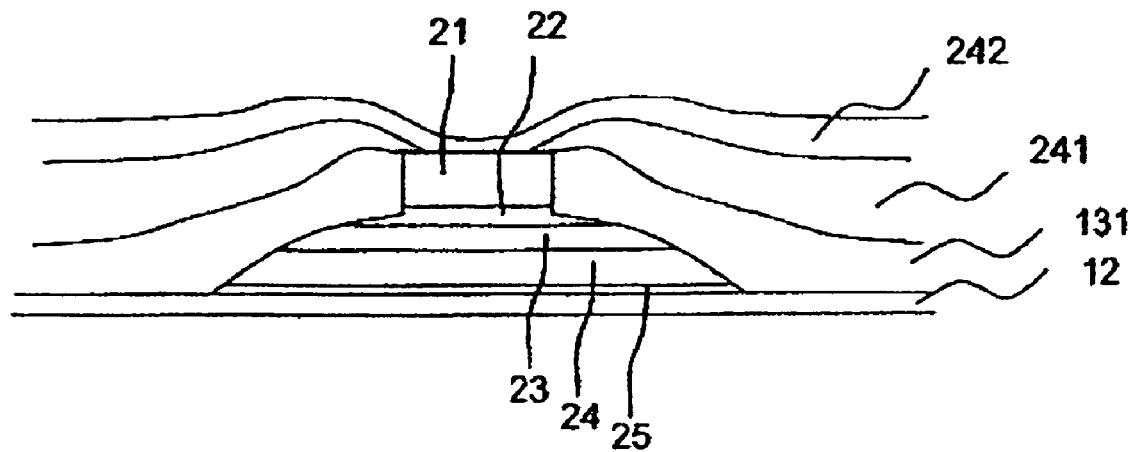
FIG. 15 is a conceptual diagram showing a structure of a CIP-GMR head according to embodiments of the present invention.

FIG. 15 shows a structure of a CIP type magnetic head having an element shape formed according to embodiments of the present invention. The magnetoresistive sensor includes a seed layer 25, an anti-ferromagnetic film 24, a pinned layer 23, an intermediate layer 22, and a free layer 21 which are formed between an insulator layer 12 and a second insulator layer 242. A domain control layer 131 is formed on both sides of the magnetoresistive sensor. An electrode layer 241 is formed over the domain control layer. The electrode layer 241 is formed of, for example, Au or Ta. An electric current flows from the electrode layer 241 through the magnetoresistive sensor in the film in-plane direction. The domain control layer 131 and the electrode layer 241 are free of unnecessary corners and steps. This makes the magnetoresistive sensor less likely to suffer physical damage. The read head thus structured according to embodiments of the present invention can produce a high output and realizes good stability.

Next, an example of CMP-assisted lift-off applicable to the present invention will be described. The lift-off is a technique for forming a small pattern. The technique is considered also applicable in removing an etching mask pattern used to form a pattern of a small track width in a magnetic head fabrication process.

Figure 16:
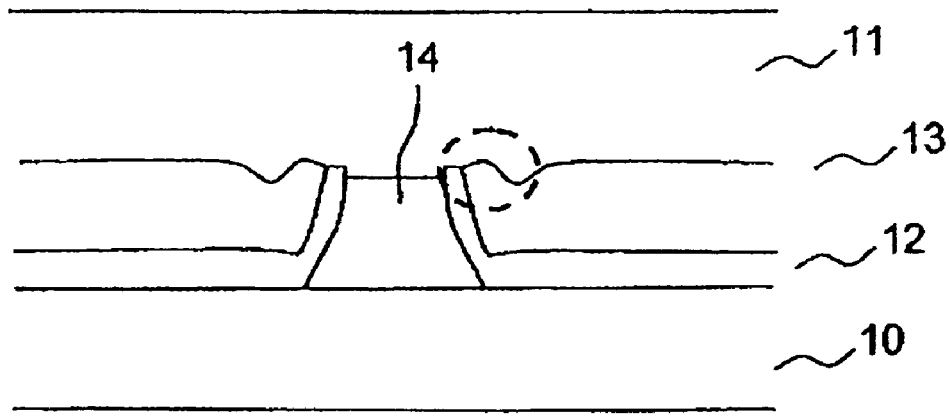
FIG. 16 is a diagram showing an example shape of a prior-art magnetoresistive sensor.

When a conventionally shaped element in which the side walls of a track are linearly formed is provided with a protective layer, for example, for an insulator layer or a domain control layer, the protective layer 13 has a severely rugged portion near the magnetoresistive sensor 14 as shown, as a conventional shape, in a dashed-line circle in FIG. 16. Therefore, when the magnetoresistive sensor 14 is locally subjected to a strong force during CMP, the portion shown encircled in FIG. 16 can be chipped off possibly causing the magnetoresistive sensor to be chipped off or deformed. This can degrade the magnetic characteristic of the element.

In the structure of a magnetoresistive sensor according to embodiments of the present invention, the magnetoresistive sensor is wider in its lower portion than in its upper portion. The force to which the magnetoresistive sensor is subjected during CMP is born by the lower portion of the element. This is considered effective in reducing element deformation and degradation. FIGS. 17(a) and 17(b) show cross-sectional transmission electron micrographs (TEM images) of a conventionally shaped magnetoresistive sensor and a magnetoresistive sensor structured according to embodiments of the present invention, respectively. The conventionally shaped element shown in FIG. 17(a) is a typical example shown for comparison purposes. The side walls of its track are linearly formed. The element came through a CMP-assisted lift-off process. The white middle portion (the portion inside the dotted-line box) in FIG. 17(a) is a confined current path layer including oxides. Its position approximately corresponds to an intermediate layer. The cross-sectional TEM image of the confined current path layer shows a crystal lattice. The crystal lattice when examined showed metallic portions with a lattice spacing of about 0.2 nm and oxide portions with a lattice spacing of about 0.25 nm. A comparison in this respect between the conventionally structured element and the element structured according to embodiments of the present invention made it known that, whereas the oxide portions are small and discontinuous in the conventionally structured element, the oxide portions in the element structured according to embodiments of the present invention are relatively long (in FIGS. 17(a) and 17(b), black lines indicate oxide portion boundaries). This is considered to be because: whereas in the case of the conventionally structured element with an untapered lower portion the force generated in CMP are unevenly applied to the element causing crystalline defects in the element; in the case of the element shaped according to embodiments of the present invention, its wide tapered lower portion reduces dynamic deformation during CMP, resulting in reduced damage to the element. A very thin oxide layer of a magnetoresistive sensor is considered to be a structurally weak part of the element. The results of the above observation, however, indicate that the damage to which a conventionally structured magnetoresistive sensor is subjected while being formed can be reduced by using an element structure and fabrication method according to embodiments of the present invention, and therefore a smaller magnetoresistive sensor to produce a larger output can be realized.

In cases where CMP-assisted lift-off is to be performed in forming a magnetoresistive sensor, a polish-resistant layer is formed between the element and a mask and over a protective layer (for example, like the one as indicated by the numeral 13 in FIG. 7) formed on both sides of the element. This is to prevent the element from being polished. The polish-resistant layer is formed of a hard material such as Diamond like Carbon (DLC). Such a hard material is used because, while it is not easily polished away, it can serve as a stopper in forming a flat surface. After the lift-off process, the DLC can be removed by ashing using oxygen. Rhodium which can be used as a protective layer material is harder than general metals, so that it can also be used as a polish-resistant layer material.

What is claimed is:

1. A magnetic head comprising a magnetoresistive sensor formed over a substrate, the magnetoresistive sensor having a pinned layer, a free layer, and an intermediate layer formed between the pinned layer and the free layer, characterized in that:
   the pinned layer is wider in a track width direction than the free layer;
   side walls in the track width direction of the magnetoresistive sensor are formed, in an upper portion in a film thickness direction of the magnetoresistive sensor, to be substantially vertical to a surface of the substrate, the upper portion including the free layer; and
   the side walls in the track width direction of the magnetoresistive sensor are formed, in a lower portion in the film thickness direction of the magnetoresistive sensor, to be upwardly convexly curved relative to the substrate surface, the lower portion including the pinned layer.

2. The magnetic head according to claim 1, characterized in that:
   a pair of magnetic shields are formed over and under the magnetoresistive sensor as viewed in the film thickness direction; and
   an electric current is made to flow through the magnetoresistive sensor in the film thickness direction.

3. The magnetic head according to claim 2, characterized in that the pair of magnetic shields also serves as electrodes.

4. The magnetic head according to claim 2, characterized in that:
   an inclination of the side walls in the track width direction of the magnetoresistive sensor is, in an upper portion in the film thickness direction of the magnetoresistive sensor, within about +/−15 degrees of vertical to the substrate surface; and
   the magnetoresistive sensor is, at a bottom of a lower portion in the film thickness direction of the magnetoresistive sensor, from two to six times as wide as the free layer in the track width direction.

5. The magnetic head according to claim 2, characterized in that the magnetoresistive sensor includes a layer containing an oxide.

6. The magnetic head according to claim 2, characterized in that the intermediate layer is a tunnel barrier layer.

7. The magnetic head according to claim 2, characterized in that the magnetoresistive sensor has a confined current path layer.

8. The magnetic head according to claim 1, characterized in that:
   a pair of electrodes is formed on sides of the magnetoresistive sensor;
   magnetic shields are formed in a lower portion in the film thickness direction of the magnetoresistive sensor, on sides of the magnetoresistive sensor, and in an upper portion in the film thickness direction of the electrodes; and
   an electric current is made to flow through the magnetoresistive sensor in an in-plane direction thereof.

9. The magnetic head according to claim 8, characterized in that:
   an inclination of the side walls in the track width direction of the magnetoresistive sensor is, in an upper portion in the film thickness direction of the magnetoresistive sensor, within +/−15 degrees of vertical to the substrate surface; and the magnetoresistive sensor is, at a bottom of a lower portion in the film thickness direction of the magnetoresistive sensor, from two to six times as wide as the free layer in the track width direction.

10. A method of producing a magnetic head according to claim 1, characterized in that the method of producing the magnetic head comprises:
- forming a lower shield over the substrate;
- forming the magnetoresistive sensor over the lower shield, the magnetoresistive sensor including the pinned layer, the free layer, and the intermediate layer formed between the pinned layer and the free layer, the pinned layer being disposed toward the substrate; and
- forming a shape in the track width direction of the magnetoresistive sensor;
- wherein the step of forming the shape in the track width direction includes:
  - forming, over the magnetoresistive sensor, an etching mask pattern which is about two to three times as high as the magnetoresistive sensor,
  - first etching in which an ion beam is injected at an incident angle within a first incident angle range with respect to substrate surface normal to substantially vertically pattern the magnetoresistive sensor up to the intermediate layer depthwise,
  - second etching in which an ion beam is injected at an incident angle within a second incident angle range with respect to the substrate surface normal, the second incident angle range being wider than the first incident angle range,
  - third etching in which an ion beam is injected at an incident angle within the first incident angle range with respect to the substrate surface normal,
  - fourth etching in which an ion beam is injected at an incident angle within the second incident angle range with respect to the substrate surface normal;
  - forming, through the steps of third and fourth etching, the side walls in the track width direction of the magnetoresistive sensor to be, in a lower portion in the film thickness direction of the magnetoresistive sensor, upwardly convexly curved relative to the substrate surface, the lower portion of the magnetoresistive sensor including the pinned layer, and
  - removing the etching mask pattern by lift-off.

11. The method of producing a magnetic head according to claim 10, characterized in that:
the first incident angle range is from 15 to 30 degrees, and the second incident angle range is from 60 to 80 degrees.

12. The method of producing a, magnetic head according to claim 10, characterized in that the step of forming the magnetoresistive sensor includes forming an insulator layer between the lower shield and a magnetoresistive film and between an upper shield and a magnetoresistive film.

13. The method of producing a magnetic head according to claim 10, characterized in that that the step of forming the magnetoresistive sensor includes forming a confined current path layer over the pinned layer.

14. A magnetic head comprising a magnetoresistive sensor formed over a substrate, the magnetoresistive sensor having a pinned layer, a free layer, and an intermediate layer formed between the pinned layer and the free layer, characterized in that:
- the pinned layer is wider in a track width direction than the free layer;
- side walls in the track width direction of the magnetoresistive sensor are formed, in an upper portion in a film thickness direction of the magnetoresistive sensor, to be substantially vertical to a surface of the substrate, the upper portion including the free layer;
- the side walls in the track width direction of the magnetoresistive sensor are formed, in a lower portion in the film thickness direction of the magnetoresistive sensor, to be upwardly convexly curved relative to the substrate surface, the lower portion including the pinned layer;
- a pair of magnetic shields are formed over and under the magnetoresistive sensor as viewed in the film thickness direction;
- an electric current is made to flow through the magnetoresistive sensor in the film thickness direction;
- side walls in an MR height direction of the magnetoresistive sensor are formed, in an upper portion in the film thickness direction of the magnetoresistive sensor, to be substantially vertical to the substrate surface; and
- the side walls in the MR height direction of the magnetoresistive sensor are formed, in a lower portion in the film thickness direction of the magnetoresistive sensor, to be upwardly convexly curved relative to the substrate surface.

15. A magnetic head comprising a magnetoresistive sensor formed over a substrate, the magnetoresistive sensor having a pinned layer, a free layer, and an intermediate layer formed between the pinned layer and the free layer, characterized in that:
- the pinned layer is wider in a track width direction than the free layer;
- side walls in the track width direction of the magnetoresistive sensor are formed, in an upper portion in a film thickness direction of the magnetoresistive sensor, to be substantially vertical to a surface of the substrate, the upper portion including the free layer;
- the side walls in the track width direction of the magnetoresistive sensor are formed, in a lower portion in the film thickness direction of the magnetoresistive sensor, to be upwardly convexly curved relative to the substrate surface, the lower portion including the pinned layer;
- a pair of electrodes is formed on sides of the magnetoresistive sensor;
- magnetic shields are formed in a lower portion in the film thickness direction of the magnetoresistive sensor, on sides of the magnetoresistive sensor, and in an upper portion in the film thickness direction of the electrodes;
- an electric current is made to flow through the magnetoresistive sensor in an in-plane direction thereof;
- side walls in an MR height direction of the magnetoresistive sensor are formed, in an upper portion in the film thickness direction of the magnetoresistive sensor, to be substantially vertical to the substrate surface; and
- the side walls in the MR height direction of the magnetoresistive sensor are formed, in a lower portion in the film thickness direction of the magnetoresistive sensor, to be upwardly convexly curved relative to the substrate surface.

* * * * *